United States Patent [19]
Vice et al.

[11] Patent Number: 6,144,236
[45] Date of Patent: Nov. 7, 2000

[54] STRUCTURE AND METHOD FOR SUPER FET MIXER HAVING LOGIC-GATE GENERATED FET SQUARE-WAVE SWITCHING SIGNAL

[75] Inventors: Michael Wendell Vice, El Granada, Calif.; Charles Edward Dexter, Highland, Md.

[73] Assignee: BAE Systems Aerospace Electronics Inc., Lansdale, Pa.

[21] Appl. No.: 09/017,455

[22] Filed: Feb. 1, 1998

[51] Int. Cl.$^7$ .................................................. H03B 19/00
[52] U.S. Cl. ........................ 327/113; 327/116; 327/119; 455/326; 455/333
[58] Field of Search .................................... 327/113, 114, 327/116, 119, 120; 455/326, 333, 323, 330

[56] References Cited

U.S. PATENT DOCUMENTS

| | | | |
|---|---|---|---|
| 3,577,206 | 5/1971 | Ferrell | 327/355 |
| 3,626,076 | 12/1971 | Uchiyama | 327/105 |
| 3,700,928 | 10/1972 | Milberger et al. | 327/170 |
| 3,700,929 | 10/1972 | Milberger et al. | 327/220 |
| 4,352,210 | 9/1982 | Puckette | 455/317 |
| 4,500,847 | 2/1985 | Hallford | 330/277 |
| 4,502,028 | 2/1985 | Leake | 333/109 |
| 4,590,616 | 5/1986 | van Glabbeek | 455/319 |
| 4,675,911 | 6/1987 | Sokolov et al. | 455/325 |
| 4,979,233 | 12/1990 | Kawahata | 455/330 |
| 5,027,163 | 6/1991 | Dobrovolny | 455/326 |
| 5,060,298 | 10/1991 | Waugh et al. | 455/326 |
| 5,130,768 | 7/1992 | Wu et al. | 257/724 |
| 5,140,705 | 8/1992 | Kosuga | 455/326 |
| 5,153,469 | 10/1992 | Petted et al. | 327/113 |

(List continued on next page.)

FOREIGN PATENT DOCUMENTS

| | | |
|---|---|---|
| 0549296 | 6/1993 | European Pat. Off. . |
| 97/23035 | 6/1997 | WIPO . |

OTHER PUBLICATIONS

Oxner, "High Dynamic Range Ming with the Si8901", Electronic Engineering (May 1986), vol. 58, No. 713, pp. 53–56.

Weiner et al., "2 to 8 GHZ Double Balanced Mesfet Mixer with +DBM Input 3RD Order Intercept", IEEE MTT International Microwave Symposium Digest, New York (May 1988), vol. 2, No. 1988, pp. 1097–1100.

Tokumitsu et al., "Divider and Combiner Line–United FET's as Basic Circuit Function Modules–Part II", IEEE Transactions on Microwave Theory and Techniques (Sep. 1990), vol. 38, No. 9, pp. 1218–1226.

Neuf et al., "Double Balanced, Coplanaer, Image Rejection Mixer Uses Molonithic Mesfet Quad", MTT–S International Microwave Symposium Digest, Boston (Jun. 1991), vol. 2, No. 1991, pp. 843–846.

*Primary Examiner*—Kenneth B. Wells
*Attorney, Agent, or Firm*—Flehr Hohbach Test Albritton & Herbert LLP

[57] ABSTRACT

A mixing method and mixer structure provide a circuit topology suitable for use in radio receivers, transmitters, tuners, instrumentation systems, telemetry systems, and other systems and devices performing frequency conversion in either homodyne or heterodyne implementations. The inventive mixer may be used for wireless communication devices including radios, cellular telephones, and telemetry systems whether land, sea, airborne, or space based, and whether fixed or mobile. The mixer provides superior intermodulation and harmonic distortion suppression and features excellent conversion loss, noise figure, port match, and port isolation as a result of its circuit topology. The mixer device circuit combines the advantages of series mixing FETs, a triple balanced design using a balanced passive reflection transformer, a precise local oscillator phase splitter, and square wave gate drive having high slew rate signal characteristics to achieve high levels of performance. It is power conservative and offers the advantage of long battery life in portable devices such as portable radios and cellular telephones as it requires only a modest amount of DC and local oscillator drive power, and is useful for operation over at least a multi-decade bandwidth.

35 Claims, 11 Drawing Sheets

SUPER-MIXER CIRCUIT (EXEMPLARY)

U.S. PATENT DOCUMENTS

| | | | |
|---|---|---|---|
| 5,280,648 | 1/1994 | Dobrovolny | 455/326 |
| 5,303,417 | 4/1994 | Laws | 327/113 |
| 5,361,409 | 11/1994 | Vice | 455/326 |
| 5,493,720 | 2/1996 | Peterson | 455/326 |
| 5,513,390 | 4/1996 | Vice | 455/323 |
| 5,551,074 | 8/1996 | Vice | 455/326 |
| 5,602,501 | 2/1997 | Shiga | 327/105 |
| 5,678,226 | 10/1997 | Li et al. | 455/333 |
| 5,697,092 | 12/1997 | Mourant et al. | 455/323 |

STRUCTURE AND METHOD FOR SUPER FET MIXER HAVING LOGIC-GATE GENERATED FET SQUARE-WAVE SWITCHING SIGNAL

INTRODUCTION

1. Field of the Invention

The invention relates generally to frequency conversion systems, devices, and methods, and more specifically to radio frequency communication devices and systems including, mixers, radio tuners, transmitters, and receivers incorporating FET mixer type frequency conversion devices for up- and down-frequency conversion.

2. Background of the Invention

Conventional frequency conversion or mixer stages in conventional RF systems have heretofore been unable to attain high levels of Spur-Free Dynamic Range (SFDR) and maintain low levels of distortion. For example, the approximately 85–100 dB Spur-Free Dynamic Range required in certain tuner/receiver systems, particularly where the output of that mixer stage was intended as the input to high performance analog-to-digital converters (ADCs) where the 100 dB SPRD, is required at the input. In fact such systems have been limited to substantially lower performance. The last or final mixer stage just prior to output to the ADC (baseband frequency converter stage) typically has the highest signal amplitude level in the tuner. A state-of-the-art ADC requires about a 2 volt peak-to-peak signal for full ADC conversion scale, and should have all spurious signal products down by about 100 dB in order to utilize the capabilities of the ADC without introducing other undesirable artifacts. These ADC performance specifications correspond to a baseband spectrum mixer stage coupled to the ADC input terminals having an input third order intercept point (IP3) of about +50 dBm and an input second order intercept point (IP2) of about +100 dBm.

Another problem in conventional mixers used in tuners is that they typically perform the final stage mixing to baseband at a low Intermediate Frequency (IF) signal amplitude level, and then boost the amplitude of the final stage mixer output with a separate power amplifier to achieve the desired ADC signal level (typically in the range of from about 1 Volt to about 4 Volts peak-to-peak). This baseband conversion approach only achieves approximately +43 dBm IP3 and +82 dBm IP2 into the ADC, may have unacceptable levels of distortion, and typically may not provide performance levels that keep with evolving state-of-the-art ADC dynamic range capability, or that meet the needs the end user.

In addition to the above described final mixer stage problems in conventional tuners, the first conversion stage of a tuner also significantly affects overall dynamic range, in fact so much so that degradation in the first stage may make it impossible to meet overall system performance requirements. For example, if the first mixing operation is too lossy, there may be an added requirement for a preamplifier gain stage in the signal path to boost the signal amplitude in an attempt to achieve the required sensitivity. However, such a preamplifier gain stage in the signal path upstream from the mixer circuit undesirably increases the required IP3 and IP2 of the mixer by an amount equal to the added preamplifier gain. Therefore, any system requirement for a preamplifier gain stage to increase sensitivity imposes even more severe constraints on other radio system components. Desirably, a mixer would have very low conversion loss in the first stage to avoid the need for any preamplification, and also have a high or large dynamic range.

One mixer known to the inventors is marketed by Steinbrecher under the name "PARAMIXER" and is purported in advertising materials to provide a mixer having an input third order intercept point (IP3) on the order of about +50 dBm and an input second order intercept point (IP2) on the order of about +100 dBm, but the inventors have not verified or confirmed such performance claims. In spite of its purported IP3 and IP2 performance figures, even this Paramixer has disadvantages. For example, such conventional mixers are relatively large (on the order of about 100 cubic inches), power inefficient (about 8 watts input power is needed to process 100 milliwatts—an efficiency of only about two percent (2%)), and expensive (for example, costing up to several hundred dollars per mixer). Therefore, although some progress has been made in improving mixer performance to achieve high quality radio systems, such developments have not solved the need for compact, small form factor, light weight devices, having lower power consumption, long battery life in battery powered devices, at moderate to low cost.

Therefore, there remains a need for high-performance radio systems including tuner, receiver, and/or transmitter components that are low-cost, compact, and energy conservative, particularly for mobile or hand-held applications. There also remains a need for mixing devices for frequency conversion generally, and more particularly for use in these high-performance radio systems, surveillance systems, and instrumentation systems.

SUMMARY OF THE INVENTION

In one aspect, the invention includes a wireless communication structure, device, and system and method for operating the same, a mixing structure for use with the wireless communication device or for use otherwise and a method of mixing signals, as well as an inventive differential square wave mixer switching circuit and method for controlling the mixer device which may be used with the inventive mixing device and wireless communication device.

The inventive mixer structure and method (also referred to as a "super-mixer" because of its superior (e.g. super) properties as compared to conventional mixers) include an overall mixer architecture topology and several embodiments of the mixer structure which present variations particularly suitable for use in a radio receivers, transmitters, tuners, as well as instrumentation systems, and other systems and devices performing frequency conversion. The inventive mixer is applicable to homodyne and heterodyne receiver/transmitter/tuner implementations, instrumentation and telemetry systems. The invention also provides structural and methodological components of the mixer including a precise mixer device with its LO phase splitter, and differential square wave gate drive. Wireless communication devices includes radios, cellular telephones, an telemetry systems whether land, sea, airborne, or space based, and whether fixed or mobile.

The inventive mixer device is advantageously a GaAs FET mixer where the FETs are implemented on a common substrate. The inventive mixer has superior intermodulation and harmonic distortion suppression and features excellent conversion loss, noise figure, port match, and port isolation as a result of its topology. The mixer device circuit combines the advantages of series mixing FETs, a triple balanced design using a balanced passive reflection transformer, a very precise LO phase splitter, and square wave gate drive to achieve its high levels of performance. It is power conservative and offers the advantage of long battery life in portable devices such as portable radios and cellular telephones as it requires only a modest amount of DC and LO drive power, and is useful for operation over at least a multi-decade bandwidth.

Therefore, one object of the invention is to provide a high-performance mixing device that achieves a high IP2 and IP3.

Another object of the invention is to provide a mixer device which is energy conservative, power efficient, and which therefore provides size, weight, and operational life for mobile and/or portable hand-held implementations.

A further object of the invention is to provide a mixer having a large dynamic range and very low distortion.

Another object of the invention is to provide a differential square wave drive circuit for use with a mixer.

Additional objects and features of the invention will be more readily apparent from the following detailed description and appended claims when taken in conjunction with the drawings.

BRIEF DESCRIPTION OF THE DRAWINGS

For a better understanding of the nature and objects of the invention, reference should be made to the following detailed description taken in conjunction with the accompanying drawings, in which.

DESCRIPTION OF SPECIFIC EMBODIMENTS

Reference will now be made in detail to the present embodiments of the invention, which are illustrated in the accompanying figures. We now turn to the drawings, wherein like components are designated by like reference numbers throughout the various figures.

Figure 1:
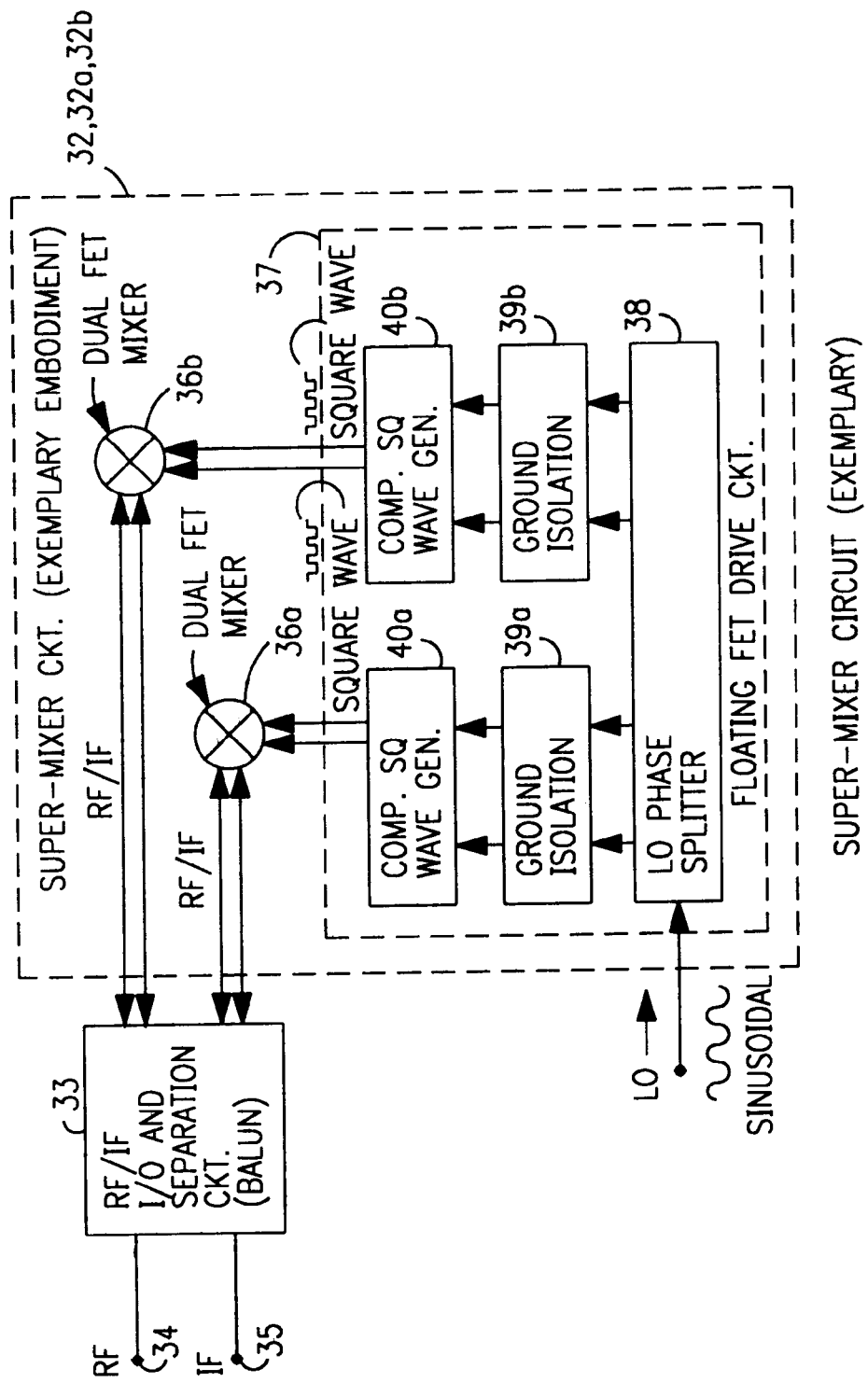
FIG. 1 is an illustration showing simplified embodiments of the invention including an inventive mixer device topology.

A simplified diagrammatic functional block diagram of an embodiment of a super-mixer 32 is now described relative to FIG. 1 which shows some of the significant features of the inventive super-mixer 32. In the embodiment shown, the super-mixer 32 is configured with and coupled to an RF/IF separation/filter circuit 33 (such as a balun) to operate as a passive reflection FET mixer wherein (when operating as a down-converter) RF energy is input to the RF/IF separation circuit at an RF port 34, and the IF output signal generated at the dual FET mixing devices 36a, 36b in a manner described hereinafter, is separated from the RF signal by the separation circuit at IF port 35. For an up-converter the roles of the RF and IF are reversed. However, the invention is not limited to passive reflection configurations.

Many different circuit topologies are known in the art for inputting a first signal at a first frequency into a generic mixing device, performing the physical mixing operation, and extracting the up- or down-converted signal a second frequency from the mixing device at an output port, so that the invention is not to be construed as being limited to the particular exemplary mixer circuit or operation environment described here. By way or example, but not limitation, the use of a transmission line transformer in a mixer has been described in U.S. Pat. No. 5,361,409 titled *FET Mixer Having Transmission Line Transformer*; the use of a balanced reflection transformer in a mixer has been described in U.S. Pat. No. 5,551,074 titled *Balanced Reflection Transformer*; the use of a dc-biased reflection transformer for a mixer and a dc-biased FET mixer have been described in U.S. Pat. No. 5,513,390 titled *Biased FET Mixer*. Structures for an unbalanced FET mixer have been described in U.S. Pat. No. 5,678,226 titled *Unbalanced FET Mixer*. Structures for a *Totem Pole Mixer Having Grounded Serially Connected Stacked FET Pair* have been described in U.S. Pat. No. 6,064,872 filed Sep. 9, 1997 and issued May 16, 2000. Each of these patents and patent applications are herein incorporated by reference in their entirety.

Continuing the description of the inventive super-mixer 32 in FIG. 1, there is also included a FET drive circuit 37 which is advantageously implemented as a "floating" or differential drive circuit. An externally generated (nominally) sinusoidal LO signal is input to a phase splitter circuit 38, which generates a phase complementary (180 degree phase difference) between two sets of differential nominally sinusoidal signals at the LO frequency. We describe the LO signal as nominally sinusoidal, because some variation from true sinusoid may be tolerated as the sinusoid is used to generate or regenerate a very high slew rate signal such as a square wave or substantially square wave which actually controls the FET gates to cause the desired FET switching. Therefore, any input signal to the complementary square wave generation circuits 40a, 40b that provides a suitable high slew rate signal to the mixing devices 36a, 36b may be used as the LO input.

The sinusoidal LO signal is split into two complementary phases and then coupled to ground isolation circuits 39a, 39b associated with each of the complementary signals paths. These ground isolated or floating phase complementary signal pairs are then coupled to a pair of square wave generation circuits 40a, 40b, the outputs of which are signals having high slew-rate leading and trailing edges, such as square waves. In one embodiment the square wave generation circuits comprise digital logic gates, such as "AND" gates, which provide a nearly perfect square wave output with two levels, very high slew-rate leading and trailing edges, and extremely low cost per device.

In one aspect, the inventive receiver incorporates a mixer device advantageously implemented triple-balanced passive reflection FET mixing devices as in GaAs on a single monolithic substrate, and a FET switch drive circuit (LO drive circuit) that provides near ideal switching.

Exemplary Mixer Device Circuit Characteristics

We now describe the structure and method of an exemplary triple-balanced passive reflection FET mixer that may be used with a variety of radio systems. The triple-balanced passive reflection FET mixer 32 has a square wave (or near square wave) switching waveform derived or regenerated from a sinusoidal local oscillator waveform, and operates in the LO/RF/IF frequency range of from about 1 Mhz to about 200 Mhz with reduced levels of nonlinearity and intermodulation distortion compared to conventional mixers as the result of the topological structure, the application of a DC bias to the FET channels, and other factors. Other embodiments of the mixer are described which extend the range of operation from 200 Mhz to tens of Ghz. The mixer 32 is useful for both up- and down-frequency conversion of RF and IF signal frequencies, through characterization as RF and IF for the primary radio receiver application are arbitrary, and various alternative embodiments have features that are advantageously implemented to optimize up-frequency conversion and down-frequency conversion respectively.

More specifically, when operating as an up frequency converter, the LO drive signal is operable within the range of from about 1 Mhz to about 200 Mhz; the RF signal is operable within the range of from about 1 Mhz to about 200 Mhz; and the IF signal is similarly operable within the range of from about 1 Mhz to about 200 Mhz. The RF, IF, and LO signal frequencies may therefore overlap so that there is no frequency exclusion.

It is therefore a feature of the present invention to produce a radio frequency mixer that has a wide dynamic range of operation and low overall signal distortion including low intermodulation distortion and partial cancellation of non-linearity distortion imposed on the radio frequency signal.

The inventive mixer 32 structure and method addresses this need for an ultra high dynamic range mixer by providing superior second and third order intercept point and compression point performance without the degradation of other mixer performance parameters, such as the conversion loss, noise figure, port isolation, and power consumption. Furthermore, the conventional need for relatively high Local Oscillator (LO) drive levels, that is LO drive levels above about one (1) Watt at the external LO input, when specifying input third order intercept points (IIP3) in the +45 dBm range, is eliminated by the LO waveform regeneration circuit of the inventive mixer. In the inventive mixer 32 LO drive, measured at the external LO input port, the inventive structure needs only about 100 milliwatts for comparable or even superior performance. Dynamic range refers to noise characteristics and conversion linearity, and the way the two characteristics combine to produce dynamic range and the useful power level over which one can operate the mixer.

Conventional approaches to mixer implementation, and radio receivers that incorporate mixing devices, use sinusoidal LO drive waveforms to drive the switching elements to ON and OFF conduction states. FET switching elements are typically used, but other types of transistors may be employed such as bipolar transistors or diodes, including for example Schottkey diodes. However, in the inventive mixer 32 structure and method, the LO drive signal applied to switch the FETs is non-sinusoidal square wave or pseudo-square wave. These square waves are generated by a novel Local Oscillator drive circuit, such as a drive circuit employing two floating CMOS "AND" gates, to generate a pair of complementary square waves from a sinusoidal LO drive input. When the complementary square wave signals are applied to the gate terminals of the mixing FETs, superior intermodulation distortion suppression and dynamic range are obtained, as compared to conventional designs employing sinusoidal or nearly sinusoidal signals. A significant component of distortion is reduced as a result of the reduced duration switching device transition duration. The switching devices spend more time in the "ON" and "OFF" states and less time in the transition phase between "ON" and "OFF" where distortion generation is maximal.

The switching devices (e.g. FETs) exhibit relatively linear characteristics in the ON or OFF states, but less linear characteristics in the transition between ON and OFF states. The inventive square wave switch drive speeds the devices through transition, reducing the time period during which distortion is generated.

Although this description focuses on the difference between a conventional LO sinusoid applied on a switching signal, and ideal or near-ideal square wave, in practical terms any periodic waveform having monotonic rise and fall segment and having suitable amplitude to trigger the square wave regeneration circuit may be used to drive the square wave regeneration circuit, and the regenerated complementary square waves driving the switches need not be perfect square waves, what is important is that they have steep slopes in rise and fall (high slew rate) so that the transition period between ON and OFF is short. Logic gates readily provide the required input/output device characteristics.

Typically the third order intercept point of each mixer device 32 is improved by up to approximately 15 dB or better (for example, from about 40 dBm to about 55 dBm), more typically by at least from 5 dB to about 10 dB (for example, from approximately 40 dBm to about 50 dBm), and dynamic range is improved equivalently. Noise figure is also improved by the inventive mixer device structure and method, resulting in greater dynamic range for each mixer device 32, for example in one embodiment dynamic range is improved by from about 10 dB to 15 dB. Intermodulation distortion is suppressed commensurate with the third order intercept improvement described above. The required sinusoidal wave LO drive measured at the LO input port terminals is also reduced by about 10 dB. Furthermore, conversion loss, noise figure, port match, and isolation between the L-port (LO-port) and the R-port (RF-port) and I-port (IF-port) are also favorably effected by square wave drive. Noise figure is improved because the longer switch transition phase of conventional mixer configurations generates more noise than does the inventive mixer 32, and reducing the time spent in the transition phase reduces noise.

The improvements in each of these areas for the inventive mixer 32 may typically be about 1 dB (conversion loss), from 1 dB to about 3 dB (noise figure), from about 1 dB to about 5 dB (port match), and from about 1 dB to about 10 dB (L-port to I- and R-port isolation), often the larger figure will be achieved, and even greater figures may be achieved, however, these are only a typical range over which improvements may be expected. Because of the very large voltage gain of CMOS gates in the transition region (typically a voltage gain on the order of about $1 \times 10^5$), the LO drive requirement for the inventive mixer apparatus and method is comparable to the most ordinary mixers, that is about 13 dBm.

A comparison between several performance figures for a conventional mixer, and the inventive super mixer 32 is provided immediately below in Table I. These performance figures are merely illustrative of the nature of performance differences to be expected and are not intended to characterize any particular circuit.

TABLE I

Comparison of Performance Figures

|  | Conventional Mixer | Inventive Super-Mixer |
| --- | --- | --- |
| Insertion Loss | 7 dB | 6 dB |
| Noise Figure | 8 dB | 7.5 dB |
| IIP3 | +35 dBm | +50 dBm |
| IIP2 | +65 DBm | +100 dBm |
| LO Drive Level | +23 dBm | +13 dBm |
| MXM | >70 dB | >95 dB |

These features and advantages of the square wave drive circuit and method as well as other features and advantages of the present invention will no doubt become clear to those of ordinary skill in the art after having read the following detailed description of preferred embodiments of the inventive mixer device 32 which are illustrated in the following figures.

Although the sinusoidal-to-square wave generation or conversion circuit may be used in other than radio receivers, and for other than mixer applications, the regeneration circuit design is described in greater detail relative to embodiments of an up-frequency and down-frequency convention below.

The inventive mixer may be advantageously configured as an up-frequency converter or as a down frequency converter. A simple embodiment of the inventive mixer is described relative to FIGS. 2 and 3. Then operation and structure of the up converter are described relative to the illustration in FIG. 4, after which minor difference in structure and operation are described for the second embodiment configured as a down-converter are described relative to FIG. 5.

Figure 2:
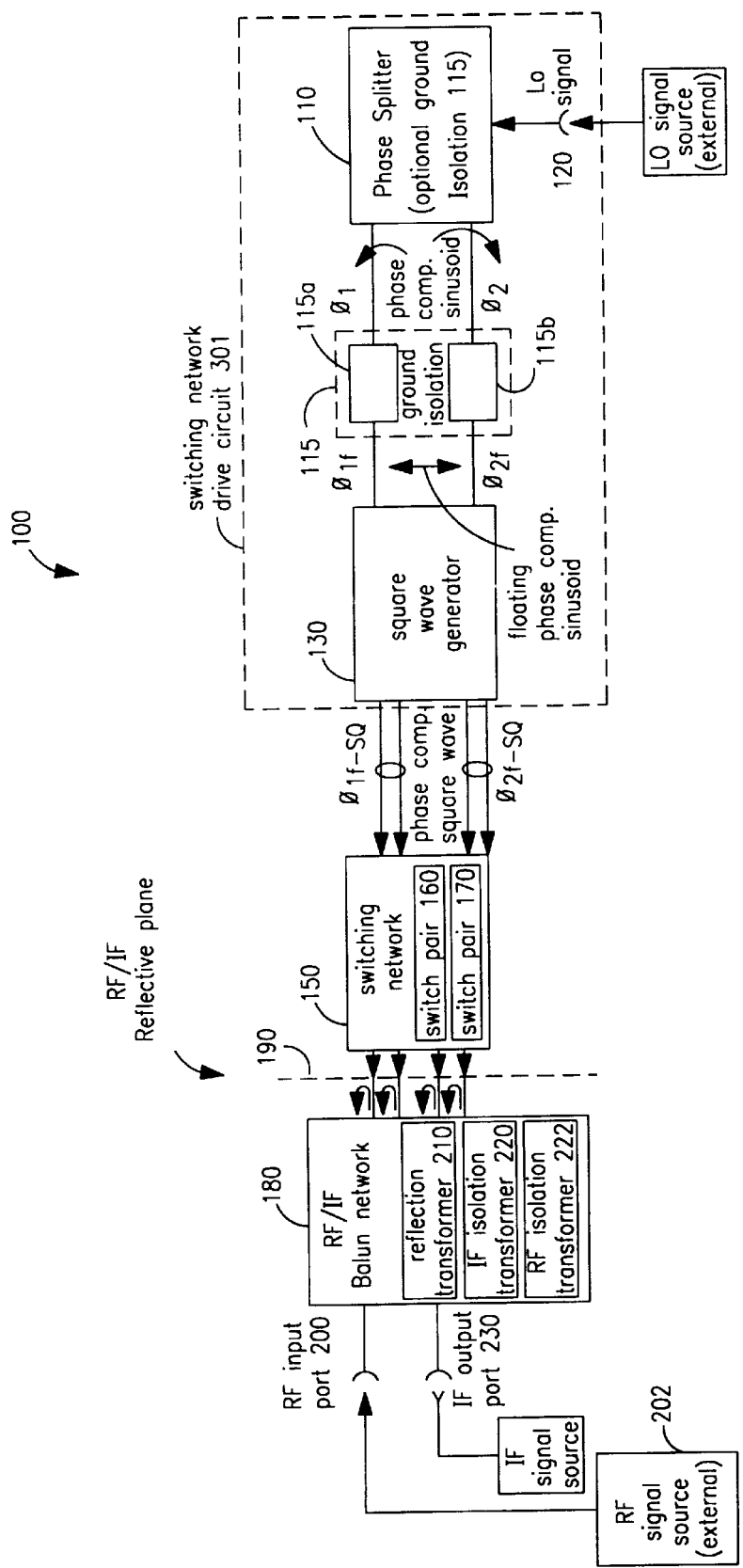
FIG. 2 is an illustration showing a simple embodiment in functional block form, of one embodiment of the inventive triple-balanced reflection FET mixer.

With reference to FIG. 2, there is shown a simple embodiment of the inventive triple balanced reflection mixer 100. Mixer 100 includes four primary functional components. A first functional component, the phase splitter 110, receives a Local Oscillator (LO) signal from an external LO signal source (not shown) at LO input port 120 and splits the LO signal into two separate phases to generate a pair of phase complementary output signals ($\phi_1$, $\phi_2$). Phase splitter 110 may also include ground isolation circuitry 115, such as ground isolation transformers 115a, 115b provided for each split phase or other means for providing ground isolation as is known in the art. Alternatively, and advantageously the ground isolation 115 may be provided by means separate from the phase splitter 110. The phase complementary signals ($\phi_1$, $\phi_2$) in the present context are signals that have substantially equal amplitude and 180-degree phase difference between them. The floating or differential signal output by the ground isolation circuitry 115 are designated $\phi_{1f}$ and $\phi_{2f}$ in FIG. 2.

A second functional component, the square wave generator 130, receives the two split phase floating sinusoidal signals from ground isolator 115 or from an integrated phase splitter 110 and ground isolation circuit 115, and generates a pair of "floating" (or differential) square wave switch drive output signals ($\phi_{1f-sq}$, $\phi_{2f-sq}$). The square wave signals are termed "floating" (or differential) because they are generated by a circuit which is isolated from ground, such as via isolation transformers. The square wave generator circuit 130 is only capable of injecting a current into a load that is connected across the two FET gate terminals 160, 170, and will not generally inject current into a load that has ground as the return path because the balanced circuit is isolated from ground, and does not desire to send current into a grounded circuit terminal or node.

A third functional component, switching network 150, here including two four-terminal switching circuits 160, 170 (see also FIG. 3 and FIG. 4), one for each switch drive signal $\phi_{1f-sq}$, $\phi_{2f-sq}$, and advantageously implemented with two pairs of serially connected MESFET pairs 671, 672 (see FIG. 4) which receives the differential square wave output signals. In this embodiment, each two or pair of FETs (Q1, Q2 or Q3, Q4) forms a four terminal switching circuit (160, 170) such that each switching circuit has two input terminals and two output terminals, and that, in total, eight terminals exit from switching network 150. The switching circuits 160, 170 are switched to complementary ON and OFF conduction states by the square wave output signals during each half cycle of the LO input signal, one ON, one OFF. Switching network 150 is connected to the reflection plane 190 of a fourth functional component, the RF/IF balun network 180. A Radio-Frequency (RF) signal is applied to mixer 100 at RF signal input port 200, and enters the RF/IF balun network 180. The RF/IF balun network 180 advantageously includes a balanced reflection transformer 210 having reflection plane 190. The ON or OFF conduction states of the switching network switch circuits 160, 170 provide the desired reflection characteristics, including occurrence and non-occurrence of signal phase reversal at the reflection plane 190. For a down converter implementation, the input RF energy reflects from switching network 150 and an IF signal emerges into an IF isolation transformer 220 and exits the mixer 100 at the IF output port 230. Advantageously, the structures of the aforementioned phase splitter 110, isolation circuit 115, square wave generator 130, switching network 150, and RF/IF balun 180 are selected to maximize second order intermodulation suppression, optimally correct any capacitive asymmetry that may be present in the RF/IF balun network 150, and are sized to prevent undue loading of the ground isolation circuit 115, such as ground isolation transformers 115a, 115b on the IF isolation transformer 220 or RF isolation transformer 222.

Figure 3:
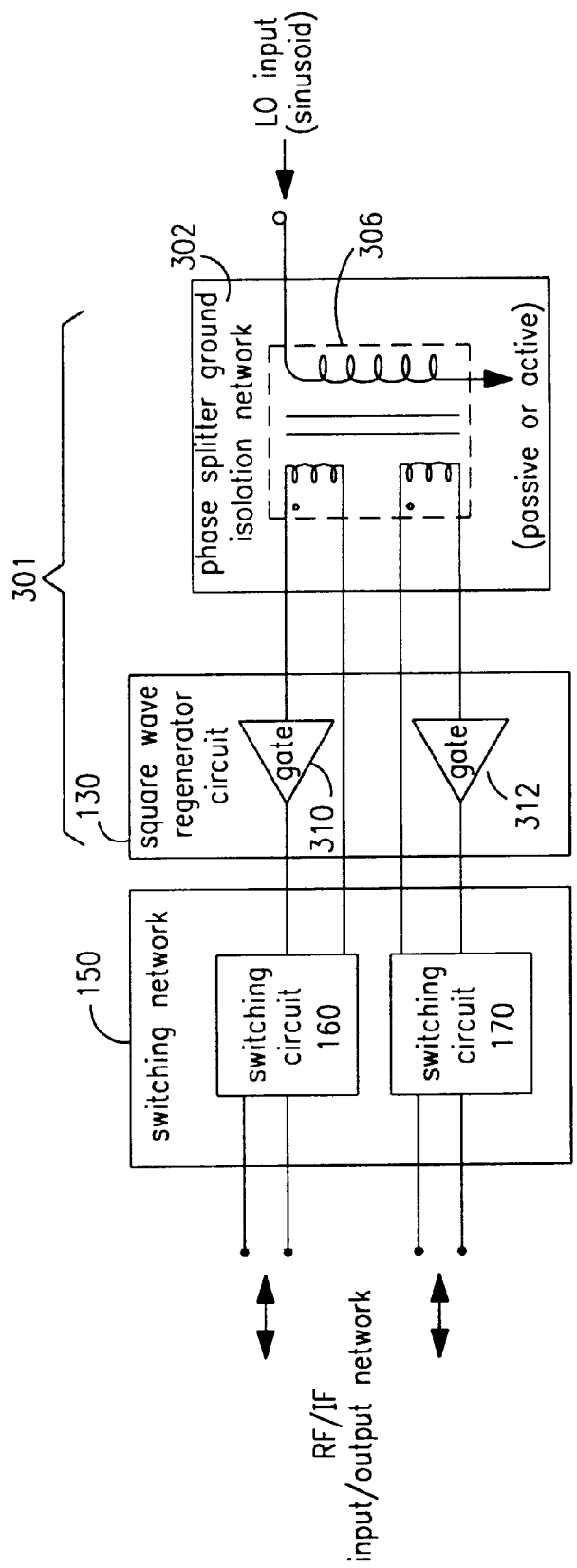
FIG. 3 is an illustration showing phase splitter, ground isolation, square wave generation circuit and switching network for an exemplary embodiment of the inventive mixer.

We now describe a simple embodiment of switching network drive circuit 301 coupled to switching network 150 with respect to the embodiment illustrated in FIG. 3. In this embodiment, phase splitter 302 also provides a ground isolation function and both phase splitting of the input LO sinusoidal signal are implemented with a passive transformer 306. In general, passive means such as a transformer having no semiconductors may be used, or alternatively, active means such as an amplifier, or floating logic gate circuit may be used, as well as other ground isolation structures and methods, as are known in the art. Square wave generation circuit 130 includes separate gates 310, 312 for each LO input signal phase output the phase splitter and the output of each gate 310, 312 is separately fed to a different switching circuit 160, 170.

Exemplary Up-Frequency Converter Super-Mixer Embodiment

Figure 4A:
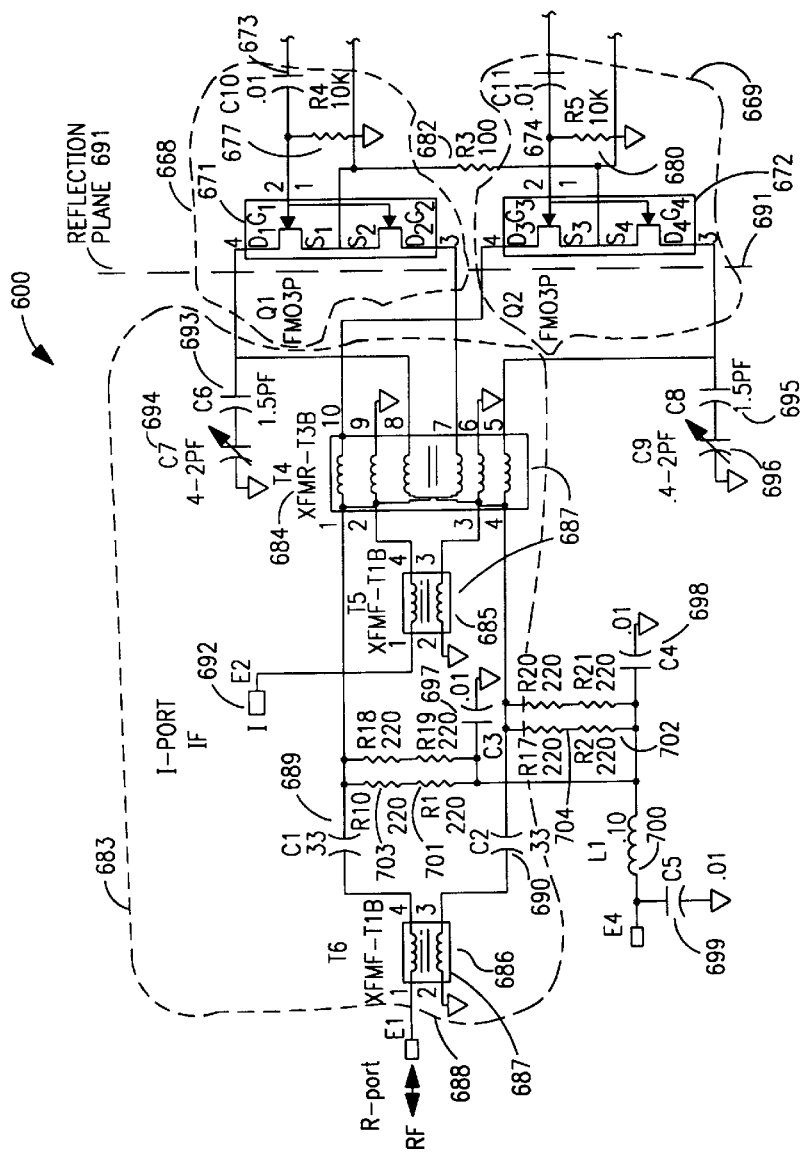
FIG. 4 is an illustration of an embodiment of the inventive triple-balanced reflection FET mixer showing additional structure of the local oscillator phase splitter, square wave generators, switching network, and RF/IF baluns, isolation transformers, as well as features enhancing performance of the mixer as an up-frequency converter.
Figure 4B:
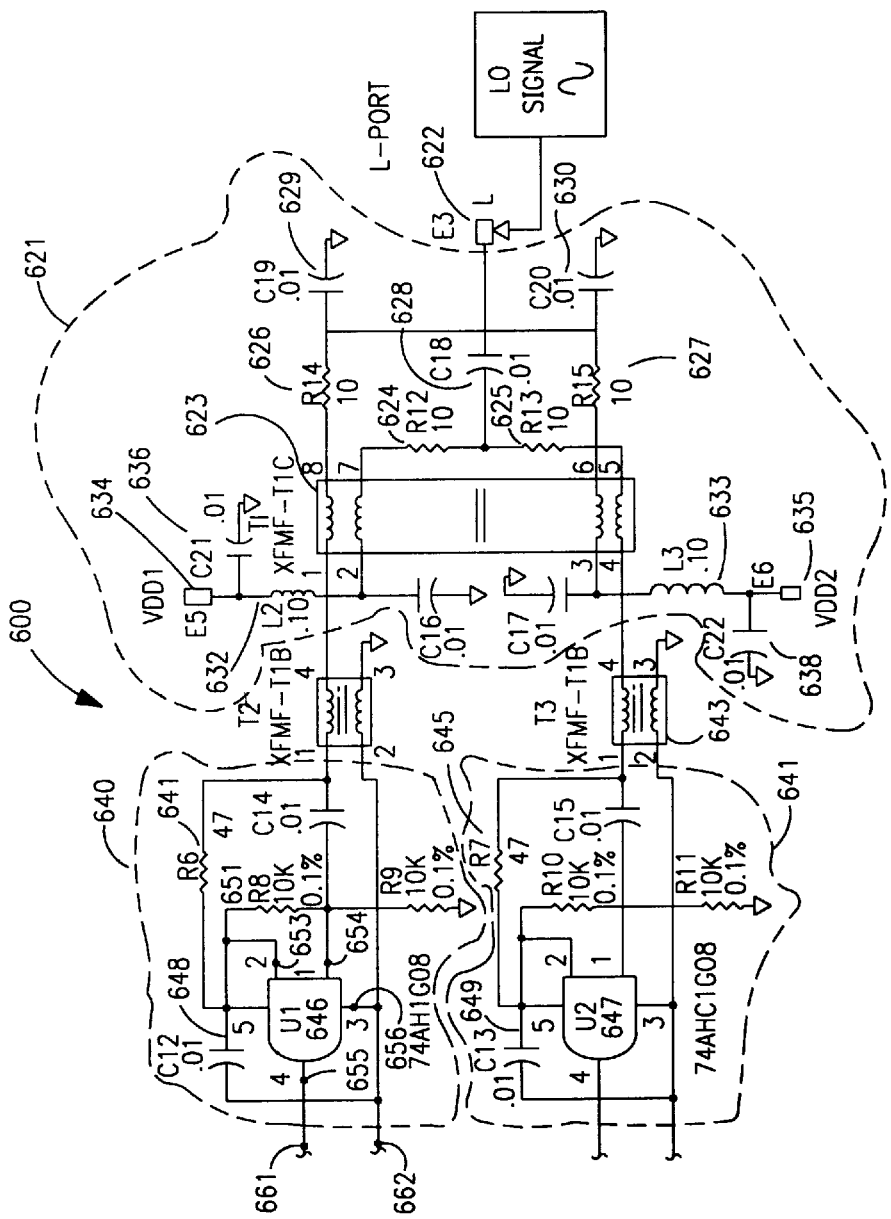

An exemplary embodiment of an up-frequency converter is now described relative to the structure in FIG. 4. Each of the five major functional components identified relative to the simple embodiment in FIG. 2 are now described in greater detail. Those workers having ordinary skill in the art will realize, in light of the disclosure provided herein, that each of the functional components has utility separate from the combination. For example, the square wave drive may be applied to other than triple-balanced mixers, or to mixers that are transmission type rather than reflection type, and that the phase splitter and/or ground isolation means, are optional for some application, and may be provided by different circuits. For example, the phase splitter circuit 110 is not needed for mixers that do not use a balanced local oscillator or a complementary local oscillator.

Reference to input port and output port are indented to pertain to this particular embodiment of an up-frequency connector in the mixer environment; however, it is understood that the mixer has a first or input port and a second or output port and that depending upon the application, the input port may have higher, lower, or substantially the same frequency as the output port, and that more generally, the first and second ports may receive or deliver a signal to the ports.

The LO Phase Splitter is now described relative to the mixer 600 embodiment in FIG. 4. The LO signal from which is derived the switch signal is input at L port 622 where it enters LO signal conditional circuitry and phase splitter transformer T1 623. Resisters R12, R13, R14, R15 (624, 625, 626, 627) ensure good impedance match for the two 50 ohm outputs (terminal pairs 1, 2 and 3, 4) of the transformer 623 while maintaining good match at input L-port 622. Capacitors C18, C19, C20 (628, 629, 630) are DC blocking capacitors. Two independent bias voltages $V_{DD1}$ 634 and $V_{DD2}$ 635 are injected into the FET circuitry via transformer T1, inductors L2–L3 (632, 633), and bypass capacitors C21 636 and C22 638 and provide bias voltage for circuits in order to place FETs in their linear region. The output of phase splitter 621, and more specifically transformer 623, generates first and second ($\phi$1, $\phi$2) balanced signals that have matched signal characteristics.

The two LO outputs from phase splitter transformer 623 are separately fed to first and second isolation transformers T2 642 and T3 643 each of which receives a two-terminal input $\phi$1 or $\phi$2 and generates a ground (or other voltage referenced) isolated floating two-terminal output which is communicated to square wave generator circuit 640.

Square wave generator circuit 640, 641 receives each output of the phase splitter 621 via isolation transformers T2 642 or T3 643. DC bias voltage from the phase splitter circuit 621 passes through isolation transformer T2 and T3, and through resisters R6 644 and R7 645, and supplies the CMOS "AND" gates U1 646 and U2 647 respectively. Here, U1 and U2 are 74AHC1G08 AND gates made by Texas Instruments, Inc. The structure and operation of square wave circuits 640, 641 are the same so that only circuit 640 is described in detail. With respect to square wave generator circuit 640, current returns through transformer T2 to ground. The bias supply voltages are locally bypassed by capacitor C12 648 (or C13 649). Resister R6 644 (or R7 645) doubles as a termination resister for transformer T2 (or T3). One input 653 of gate U1 is tied to the bias supply, while the other input 654 is biased to half voltage by means of resister divider network R8 641 and R9 652. Capacitor C14 654 couples the LO signal to gate U1 646 without disturbing the gate U1 bias point. Pins 4 655 and 3 656 of U1 form a first floating square wave output at terminals 661 and 662. An identical second square wave generator 651 is fed by transformer T3 in analogous manner to form a second floating square wave output at terminals 663 and 664.

The use of transformer T1 623 at the output of phase splitter to provide some isolation from ground may be adequate for certain applications. In such cases, transformers T2 642 and T3 643 would not be required and the phase splitter outputs would be sent directly into the square wave generator circuits 640, 641. Transformers T2 and T3 serve to better isolate the floating circuitry, that is gates U1 646 and U2 647, and their surrounding components from ground. And, at the same time the burden of achieving the floating condition is advantageously removed from the phase splitter transformer T1 623, so that the two operations (LO signal phase splitting and ground isolation) may be separated and more precisely achieved by providing explicit separate transformers for each one operation. That is, transformer T1 is responsible for phase splitting, and transformers T2 and T3 are responsible for ground isolation, and each can be designed to optimally perform its function.

The inventive circuit 600 phase splitter and ground isolation means provides benefits or conveniences in addition to those already described. For example, a DC current path from the common sources (S1, S2) of the mixing FETs to ground is advantageously provided by transformers T2 and T3. Providing the transformers T2 and T3 in the circuit also provides the ground isolation very nicely without participating in the phase splitting function, and the phase splitter 621 accomplishes its job without having to generate a large amount of ground isolation. In fact, for this embodiment, phase splitter 621 does not have to generate any ground isolation because terminal pin 2 of transformer T1 is AC coupled directly to ground so that it is still a ground referenced signal. Terminal pin 3 for the second phase is also AC coupled to ground in like manner. Furthermore, phase splitting is more readily accomplished if one can maintain a ground referenced signal during the phase splitting operation, and then isolate those split signals from ground. While one may accomplish phase splitting in a single ground isolated circuit, typically the accuracy of the operation is diminished when it is accomplished by a single transformer.

Square wave generation circuits 640 and 641, such as logic gates U1 and U2, may be implemented by NAND, AND, OR, NOR, XOR, XNOR gates with appropriate modification to the circuit, as well as other so-called primitive gates. A gate is designed to generate two discrete logic levels (about 0 volts and about 5 volts for CMOS) representative of the two levels of a square wave. These two levels as well as the voltage range provided by the logic gate are convenient for driving the mixing FETs, if the input is made to toggle from a one "1" to zero "0" by any means, whether it be another square wave (which is a traditional input to a for a logic circuit non-mixer application gate) or by a sinusoidal wave of proper amplitude, then the output of the logic gate will look like a square wave. It will toggle rapidly between "0" and "1" states and spend very little time in transition between the states. This is a highly desirable waveform shape for driving the mixing FETs. It is low-cost, physically small because the logic gates are integrated onto a single chip, easy to float in an RF circuit, and it consumes extremely small power (on the order of about 35 milliwatts) per gate.

Because the logic gates each generate two discreet levels (for example, about zero (0) volts and about five (5) volts for micro-gate logic family), the amplitude of the gate output is limited, and the output level does not correspond to a high amplitude sinusoidal signal except that in the sense that the slew rate of the square wave gate output signal is very high, this high slew rate has the effect of a very large amplitude sinusoid in terms of minimizing the period of time spent in transition between ON and OFF conduction states of the FETs. The need for a high sinusoidal LO drive level is therefore alleviated by the greatly improved high slew (square wave) drive waveform shape, hence, only about 20 milliwatt (mW) of power is required to operate the inventive structure. This compares to about 200 milliwatt for conventional structures. The benefit is achieved because the shape of the square wave is ideal, or at least more nearly ideal than the conventional sinusoidal signal.

Power consumption is also reduced because the gate does not drive a resistive load, rather it drives the small capacitive load of the FET junction capacitance. Impressing a voltage waveform across a capacitive load does not use or consume power in the manner that impressing a voltage waveform across a resistive load would. In general, it is good design practice for one circuit component to provide a good match with other circuit components and with the system as a whole, such that the power incident on an input port of the circuit should be properly terminated and converted to heat rather than reflected (unless such reflections are desired in a particular circuit). If the operating power of a circuit is high, then the power consumed is also high because all the energy required by the circuit is normally converted to heat when the circuit is properly terminated to eliminate reflections.

One embodiment of the inventive circuit only terminates about 13 dBm, which is 20 milliwatts. The circuit thereafter generates somewhat larger signal levels, which are more ideally shaped, but these signals are applied to a capacitive load and are not terminated into any resistive load. In fact, the signals are presented to the capacitive load of the FET gate, so that the inventive circuit is "power conservative" and the gates themselves require minimal power, typically only about 35 milliwatts to perform their mixing function. This circuit is therefore far more power conservative than conventional circuits that would use or require a large magnitude conventional sinusoidal signal LO drive, or LO drive coupled to a high gain amplifier to provide the 200 milliwatt operating power.

This inventive power conservation feature is advantageous for portable or battery powered radio products, and could for example be of great benefit in a mobile communication handset, in that better performance would be obtained at considerably lower power than is obtainable with conventional structures. The invention therefore provides for power conservation in mobile radios and modems, cellular telephones, and any other devices that use a mixer, especially for battery-powered devices where battery life and/or radiated power for a particular operating time are a significant concerns. Of course even in stationary or non-battery powered applications, the benefits of power conservation would be achieved. In both mobile and stationary application, heat generation and dissipation concerns that may reduce product life are also reduced. Satellite developed communication devices (typically dependent on battery, fuel cell, or solar power) employing large mixers may also benefit as a result of reduced operating power and reduced thermal power generation.

Separate phases ($\phi 1$, $\phi 2$) of sinusoidal LO signal are coupled to terminals of first and second logic gates 121, 122, here CMOS "AND" gates, such as the 74AHC1G08 manufactured by Texas Instruments. Those workers having ordinary skill in the art in light of this disclosure will appreciate that logic gates 121, 122 other than "AND" gates, such as, but not limited to, NAND, OR, NOR, XOR, and that other logic gates may be used either alone or with the addition of additional gates or conditioning circuitry, and that logic families other than CMOS, such as, but not limited to TTL, ECL, or other logic families may be used to implement the selected gates.

The gates 205, 206 form the square wave generator circuit and may alternatively be replaced with other circuits or devices which generate a high slew rate signal in response to the input sinusoid. For example, Schottkey diodes may be used in place of gates to increase the mixers applicability into the gigahertz (GHz) frequency range. Furthermore, it may be desirable to isolate the diodes from ground by providing ground isolation either within the phase splitter means or as a floating drive circuit. In some circuit topologies ground isolation may not be required.

Independent bias voltage inputs for the two CMOS "AND" gates allows precise trimming of the output square wave amplitudes, which is useful in optimizing second order intercept point. Due to the excellent gain of the CMOS logic gates, very little LO sinusoidal drive power is required. Potentially as little as 0 dBm of LO sinusoidal signal drive applied to the gates would still result in normal mixer operation. One embodiment of the inventive mixer device achieves a conversion loss of about 6 dB, a noise figure of about 7 dB, a port return loss of about 15 dB, isolation between any ports greater than about 40 dB, and input IP2 of about 90 dBm, and input IP3 of about 45 dBm. These input intercept points (IIP2 AND IIP3) are achieved with only a +13 dBm LO sinusoidal drive level.

In an alternative exemplary mixer configuration (not shown) that provides source-to-source serially connected FETs with grounded source, such mixer would also advantageously be provided with square wave LO signal derived drive. However, since the FET source terminals of such a mixer would be grounded, and the load connected to the mixer would be ground referenced, there is no need for a phase splitter. Such mixer configuration would only require the logic gate to receive the sinusoidal LO input signal directly.

In yet another alternative embodiment, if the load is merely grounded or ground referenced, then providing a floating square wave drive differentially placed across the FET gate and source terminals, there is no need for a balanced circuit, and one may use an unbalanced diplexer with its utility and advantages. Here, no phase splitter would be needed, but a transformer would be provided to achieve ground isolation.

Therefore, it should be understood, that the use of square waves for driving the FET switches is useful, and even more significantly, the use of non-ground referenced floating drive is compelling, and that greater benefit to performance is achieved by the combination of the square wave drive with floating or differential drive features.

Mixers are used in communications electronics including cellular communication systems and devices, space communications, ground communication stations, instrumentation and test equipment, no name only a few mixer applications. The particular embodiment of the device being shown and described with respect to FIG. 4 may have a useful bandwidth up to several hundred Megahertz. But, with appropriate modifications readily appreciated, in light of the disclosure provided herein, by workers in the art, other embodiments of the invention readily extend this bandwidth range to tens of Gigahertz. For example, the invention may also be used in a base station application where there may be more than one mixing or frequency conversion process during the down-conversion of the incoming 900 Mhz or higher frequency signal to an intermediate frequency (IF) signal, and then a second down-conversion from that IF to baseband. In this base station application, the inventive mixer device may be used for the second (IF-to-baseband) conversion to obtain very high linearity. This makes sense because the back end of such a system normally has the gain of previous stages to contend with, and so it is working at higher signal levels. Preservation of the higher levels of linearity are important in those back end stages in order to preserve the intercept point of the whole receiver.

There are other square wave regenerating devices and methods other than logic gates that could be floated in the manner described here, that have bandwidths up to one or a few gigahertz. Specifically, a method using step-recovery diodes as the square wave generation means may be applied up to about a few gigahertz, and which may be implemented in a small size within a floating environment. An amplifier run in hard saturation will also convert a sinusoidal wave into a square wave by clipping it symmetrically. Even a simpler embodiment of the mixer circuit may be provided that would allow the level of the sine wave be fairly high and by using back-to-back Schottky diodes the large amplitude sine wave would be clipped into a lower amplitude square wave. While this alternative technique would not be very power efficient, requiring relatively large sine wave power levels, it would be elegant, and could be implemented at microwave frequencies up to several to tens of gigahertz, for example from about 1 GHz to 50 GHz or more. Therefore, such a circuit may also be provide for operation a cellular band and/or PCS band frequencies.

Small physical device or component size is important when trying to float a component because large physical dimensions typically imply a large amount of coupling capacitive or inductive parasitics between the component and the ground plane of the circuit or to the enclosure of the circuit. By keeping dimensions of the logic gates that generate the square wave small (easily accomplished using readily available commercial logic gate chips or custom designed and fabricated logic gates), the coupling is minimized and it is possible to float circuits and isolate them from ground and from the enclosure very effectively. These commercial logic gates cost on the order of less than a dollar per gate in small numbers, and fractions of a dollar per gate in quantity so that use of such gates in the mixer has significant cost advantages as well as performance advantages.

Switching devices, such as FETs, have undesirable characteristics at points of transition in replicating a short circuit and an open circuit. For a switching device, one prefers the device to be operating as either a short or as an open circuit, and rapidly toggling between the two states. In order to get between the states, the switching device must pass through a transition state. It is during the transition state or phase that the transistor, diode, or other switching element or circuit being used, displays the maximum amount of nonlinearity, generates the maximum amount of distortion components, and injects a maximum amount of noise into the circuit. The perturbation (or destruction) of mixer port-match and mixer isolation is also typically worse during the transition phase than at any other time because the non-ideal (and typically time varying) impedance value exhibited by the switch during the transition, is a different impedance than the circuit has been designed to have. Therefore, the faster the switch moves through the transition phase, the less time the mixer circuit has to endure the hardships associated with transition phase characteristics. An "ideal" square wave is infinitely fast and does not spend any time in the transition. The ideal square wave also has a fifty-percent (50%) duty cycle and perfect signal symmetry (e.g 180 degrees). Feedback circuits can also optionally be used to insure that perfect symmetry and duty cycle characteristics are precisely maintained over a range of operating conditions and environments. In practical terms, a real square wave or pseudo-square wave form by high slew rate but which is somewhat bandwidth limited transits the transition phase in a minimum time. For these and other reasons, the square wave is an optimal waveform for driving a mixing device.

All of the benefits for method an structure for reducing intermodulation distortion as a result of back-to-back (source-to-source) serial connection of the FETs making up a switch in U.S. Pat. No. 5,513,390 which is incorporated herein by reference remain valid, and the use of the square wave to drive the FET switches further reduces the distortion that might otherwise require cancellation, and also provides the additional benefits already described. The pair of series connected mixing FETs in the inventive mixer device offer the benefit of improved linearity and reduced distortion over that of a single FET.

With respect to the signal mixing structures and methods generally, the use of series connected (source-to-source) Field Effect Transitions (FETs) to reduce intermodulation distortion in a mixer and other advantages has been described in U.S. Pat. No. 5,752,181, incorporated herein by reference.

Figure 6:
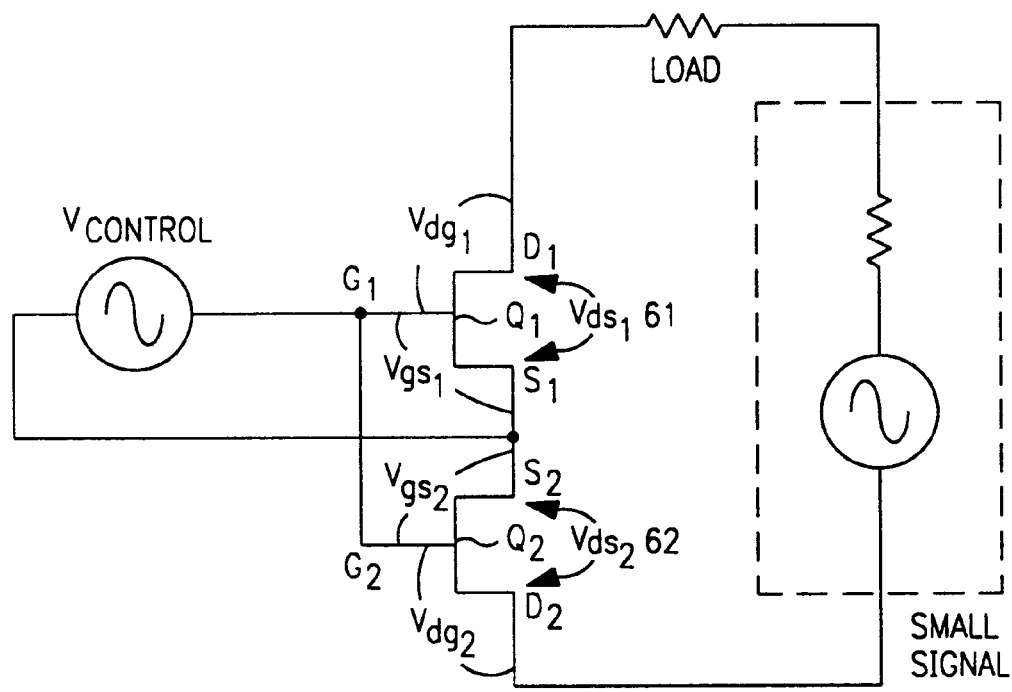
FIG. 6 is an illustration showing a source-to-source serially connected dual-FET structure and the manner in which the structure reduces distortion.

FIG. 6 aids in illustrating how back-to-back FETs cancel intermodulation distortion in the mixer circuit. For the circuit of FIG. 6, the gate-to-source voltages for each FET are equal and also equal to the FET control voltage. Furthermore, for each FET the SUM of the gate-to-source voltage and the source-to-drain voltage is equal to the gate-to-drain voltage. Therefore, $$Vg_1s_1 = V_{control}$$

$$Vg_2s_2 = V_{control}$$

$$Vg_1d_1 = Vg_1s_1 + Vs_1d_1$$

$$Vg_2d_2 = Vg_2s_2 + Vs_2d_2.$$

To a first approximation, $Vs_1d_1 = -Vs_2d_2$ where $Vs_1d_1$ is the source-to-drain voltage across transistor Q1, and $Vs_2d_2$ is the source-to-drain voltage across transistor Q2. Also, to a first approximation, $\Delta R_{ds} = c \times \Delta V_{gd}$, which says that the channel resistance across the drain-to-source channel ($\Delta R_{ds}$) is linear (to a multiplicative constant c) to gate bias voltage ($\Delta V_{gd}$). This assumption is nearly correct during the time that the FETs are heavily conductive. Note that the two FETs are ideally matched such that they behave the same, and let $Rd_1d_2$ be the total series resistance of the two FETs Q1 and Q2, and the change of channel resistance $\Delta Rd_1d_2$ be that component of the channel resistance causing intermodulation distortion. Then, $$\Delta Rd_1d_2 = c \times (\Delta Vg_1d_1 + \Delta Vg_2d_2)$$

$$= c \times (Vs_1d_1 + Vs_2d_2)$$

$$= 0$$

The small signal passes through the FET channel combination without controlling its resistance. This condition is equivalent to infinite intermodulation suppression. This is the technique used in mixer to help reduce intermodulation distortion.

Aspects of distortion cancellation in series connected FETs is now described. When a signal voltage is applied to the drain of a FET, there exists a voltage $V_{ds} = V_{sig}$ across the channel of the FET. Regardless of the gate voltage, the channel resistance (and impedance) of the FET is not constant, but is modulated by the voltage $V_{sig}$. The result or effect of this process is nonlinearity distortion signals generated across the channel and appearing as a distortion voltage $V_{dist}$. Hence, the total voltage across the FET drain to source channel ($V_{ds}$) is the sum of the signal voltage ($V_{sig}$) plus the distortion voltage ($V_{dist}$); such that:

$$V_{ds}=V_{sig}+V_{dist}.$$

In general, the distortion signal can be separated into two distinct components. The first component is the "odd order" distortion voltage ($V_{dist,odd}$). It has the property of retaining the sign information of the signal voltage that caused it, whence:

$$V_{dist,odd}(-V_{sig})=-V_{dist,odd}(V_{sig})$$

On the other hand, the "even order" distortion voltage ($V_{dist,even}$) does not retain the sign information, so that:

$$V_{dist,even}(-V_{sig})=V_{dist,even}(V_{sig})$$

When two FETs are connected serially back-to-back, with their respective sources tied to one another and their respective gates tied to one another, a signal voltage $V_{sig}$ can be applied to the FET pair as a potential difference between the two drains $D_1$ and $D_2$. This results in the relationships:

$$V_{ds1}=V_{sig}/2$$

$$V_{ds2}=-V_{sig}/2$$

where $V_{ds1}$ is the drain-to-source voltage for the first FET and $V_{ds2}$ is the drain-to-source voltage for the second FET and the total voltage is split between the two. Taking the distortion components into account, the relevant voltages are:

$$V_{ds1}=V_{sig}/2+V_{dist,odd}(V_{sig}/2)+V_{dist,even}(V_{sig}/2)$$

$$V_{ds2}=-V_{sig}/2+V_{dist,odd}(-V_{sig}/2)+V_{dist,even}(V_{sig}/2)$$

Utilizing the definitions of even and odd order distortion described above, it follows that:

$$V_{ds1}=V_{sig}/2+V_{dist,odd}(V_{sig}/2)+V_{dist,even}(V_{sig}/2)$$

$$V_{ds2}=-V_{sig}/2-V_{dist,odd}(V_{sig}/2)+V_{dist,even}(V_{sig}/2)$$

When this connection of FETs occurs in a mixer, the distortion that is coupled to the surrounding circuitry and to the output port of the mixer is the difference in potential between the two drains:

$$V_{ds1}-V_{ds2}=V_{sig}+[2\times V_{dist,odd}(V_{sig}/2)]$$

Thus, in theory complete cancellation of the even order distortion can occur, while no cancellation of odd order distortion is obtained. These relationships hold irrespective of whether the FET drain $D_2$ is grounded or not.

Several benefits follow from the FET-pair connectivity and voltage relationships. First, complete cancellation of intermodulation distortion requires that the distortion be generated in precisely equal magnitude within each of the two FET's, and summed in opposite directions to achieve the distortion cancellation. Where some slight variation in magnitude may be present, such as might be present by normal device process variation, the distortion is reduced commensurate with the degree of matching.

Second, the generation of equal magnitude distortion by each transistor (FET) requires that the transistors have identical gate-source voltages ($V_{gs}$) at all times, that is during all phases of the control (e.g local oscillator) signal. This second condition is strictly true in the invention because the two FET's have common gate terminals and common source terminals, so that these terminal pairs are always at the same voltage potential independent of the absolute voltage potential or time.

Third, distortion cancellation also benefits from having the same drain-to-source ($V_{ds}$) voltage for the two FET's in each switch at all times. This condition also is present because the identical gate-to-source voltage ($V_{gs}$) results in the same channel resistance for the two FET's, which results in an identical voltage drop across the two FET channels.

Finally, the distortion produced by each of the two FETs operating as a pair is summed by means of the back-to-back serial connectivity between the two FETs, so that the distortion is canceled. This condition is met in the invention by the common source connection of the two FETs, and by the connection of the two drains of the FET pair to the mixer ports.

Conversion loss, noise figure, and intermodulation suppression are even further enhanced by the use of a square wave gate drive. The square wave switches the mixing FETs rapidly between ON and OFF states, thus avoiding the lossy and strongly nonlinear transition state substantially. Further improvements in second order intermodulation suppression are achieved by providing precise balance in the mixer circuit, which assists in maintaining cancellation of unwanted mixer products. The balance desired, and the performance achieved in one embodiment, is at least partially attributed to the ideal characteristics of the balanced reflection transformer which cancels second order non-linearities.

Isolation transformers are advantageously used at the RF and IF ports, as well as at the CMOS gate inputs to preserve the balance of the mixing process. The balance is advantageously improved even further by providing a well matched LO phase splitter transformer 623 in the mixer 600, where input series resistors (e.g. R12, R13, R14, R15) are added to completely eliminate standing waves in the transformer 623. Resistors R12–R15 along with capacitors C19–C20 decouple the LO signal from the gate bias. This structure ensures very accurate phase control.

Those workers having ordinary skill in the art in light of the description provided herein will now appreciate the benefit of providing a square wave switching drive signal but may not immediately appreciate the manner in which the inventive structure and method provide the means for achieving a square wave drive in the mixer circuit without adversely effecting other conditions of the circuit or system in order to obtain high-performance. The inventive structure provides a synergistic set of structures and processor to introduce square waves into the mixer. Also, to implement the square wave drive, over a broad band of frequencies in balanced form, and/or in ground isolated form is difficult and not disclosed or suggested by conventional structure or methods know to the inventors.

If the square waves were merely generated at a point in the circuit where the square wave signals were still ground referenced, a portion of the mixer circuit design might be somewhat simplified as compared to the inventive mixer circuit in which the square wave drive signals are generated separate from ground isolation; however, in such a circuit, there would be a further requirement to pass the ground referenced square wave through an isolation transformer.

It is well known that square waves have a very large bandwidth. Unless the transformer(s) had incredibly high performance, including of course a very large bandwidth, such isolation transformer(s) would bandwidth limit and otherwise distort the square wave, and one would wind up with a distorted output signal that might no longer look or perform like the input square wave and would no longer work to drive the switches as required. Implementation of such very high performance transformer with its associated high costs in a mixer would probably not be practical, even if such an optimal transformer were available. It is also noted that digital circuits having logic gates, such as CMOS "AND" gates, are generally ground referenced, so that application of digital gates in a floating signal environment particularly in an analog circuit is advantageous but quite unusual. Finally, it should be noted that square wave drive (in floating or non-floating environment) such as a square wave device using digital logic gates, is also applicable apart from mixer circuit.

The FET Switching Networks 668, 669 are now described relative to the embodiment illustrated in FIG. 4. FET pair Q1 is formed from a pair of identical MESFETs each having a drain (D1, D2), a gate (G1, G2), and a source (S1, S2) connected together to form a four terminal switching circuit 671. The first switch circuit 671 is switched on and off by the square wave output of gate U1 646, which is capacitively coupled to the gates of Q1 via capacitor C10 673. Note that the gates of the FETs making up Q1 are tied directly together and that the sources are also connected together so that the two FETs are connected serially back-to-back (source-to-source). Capacitors C10 and C11 serve to allow the gate terminal of Q1 to self bias while resistors R4 and R5 acts to further control the self bias point by a gate ground return. The second switching circuit Q2 672, capacitor C11 674, and resistor R5 680 function in a like manner. Resistor R3 682 ties the two switching networks 668, 669 together at the common FET source nodes and how a resistance value (here 150 ohm) is chosen to maximize second order intermodulation suppression. Second order intermodulation suppression is positively affected by R3 because it keeps Q1 and Q2 at equal potentials but isolates them.

The exemplary RF/IF Balun Network 583 is now described relative to the embodiment illustrated in FIG. 4. Transformers T4, T5 and T6 (684, 685, 686) operate as a balun network 687. For a mixer operating as a down converter, RF signal energy enters the mixer at the R-port 688 where it is ground isolated by RF port isolation transformer T6 686, through DC blocking capacitors C1 689 and C2 690 as the RF signal enters balanced reflection transformer T4 684. Switching networks Q1 and Q2 (671, 672) are connected to the reflection plane 691 of transformer T4 634 such that the RF signal energy reflects off Q1–Q2 and emerges as the IF signal into IF isolation transformer T5 685 and out the I-port 692. Slight capacitive asymmetry in the balun network, if any, may be trimmed out by means of capacitors C6 693, C7 694, C8 695, and C9 696. Means for injecting a drain bias at Vdd bias for Q1 and Q2 is provided by filtering network C3 697, C4 698, and C5 599 and L1 700, and by resistors R1 701, R2 702 and R16 703, R17 704. The four resistors (R1, R2, R16, R17) are chosen to prevent undue loading of the RF isolation transformer T6 and T4.

Exemplary Down-Frequency Converter Super-Mixer Embodiment

Figure 5A:
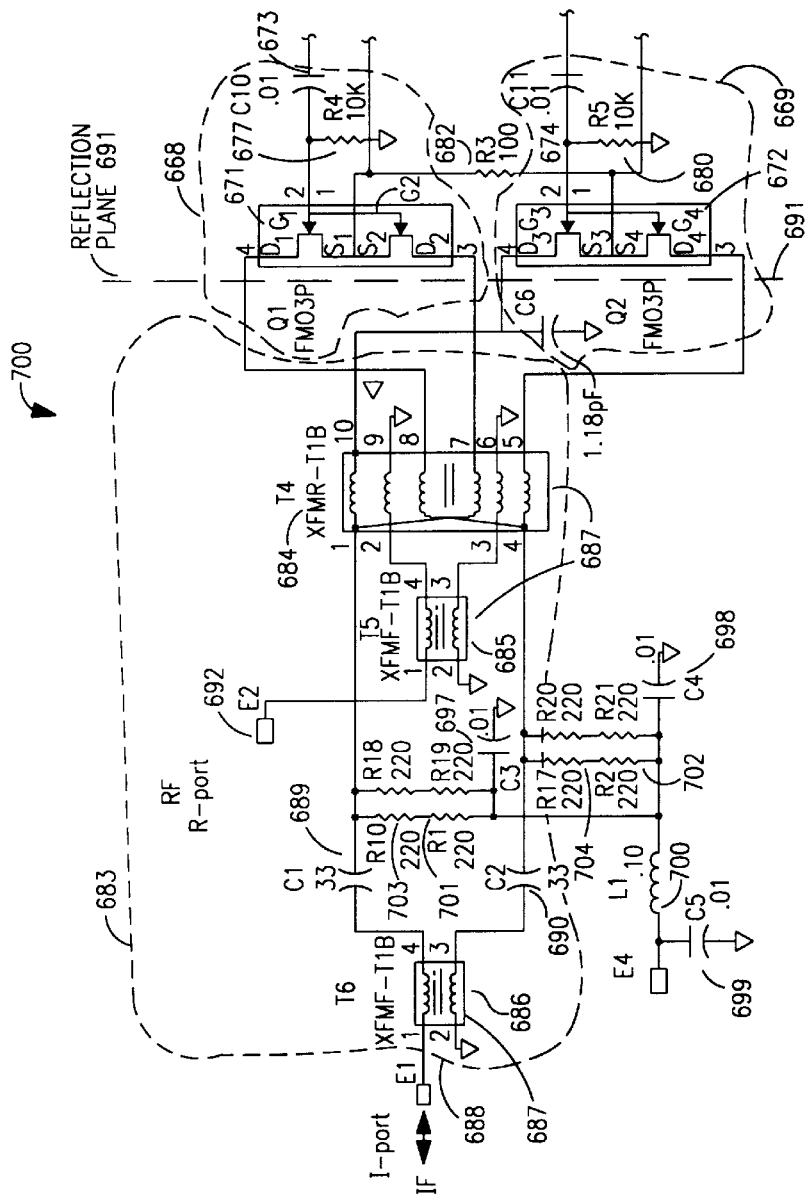
FIG. 5 is an illustration of yet another embodiment of the inventive triple-balanced reflection FET mixer showing additional structure of the local oscillator phase splitter, square wave generators, switching network, and RF/IF baluns, isolation transformers, as well as features enhancing performance of the mixer as an down-frequency converter.
Figure 5B:
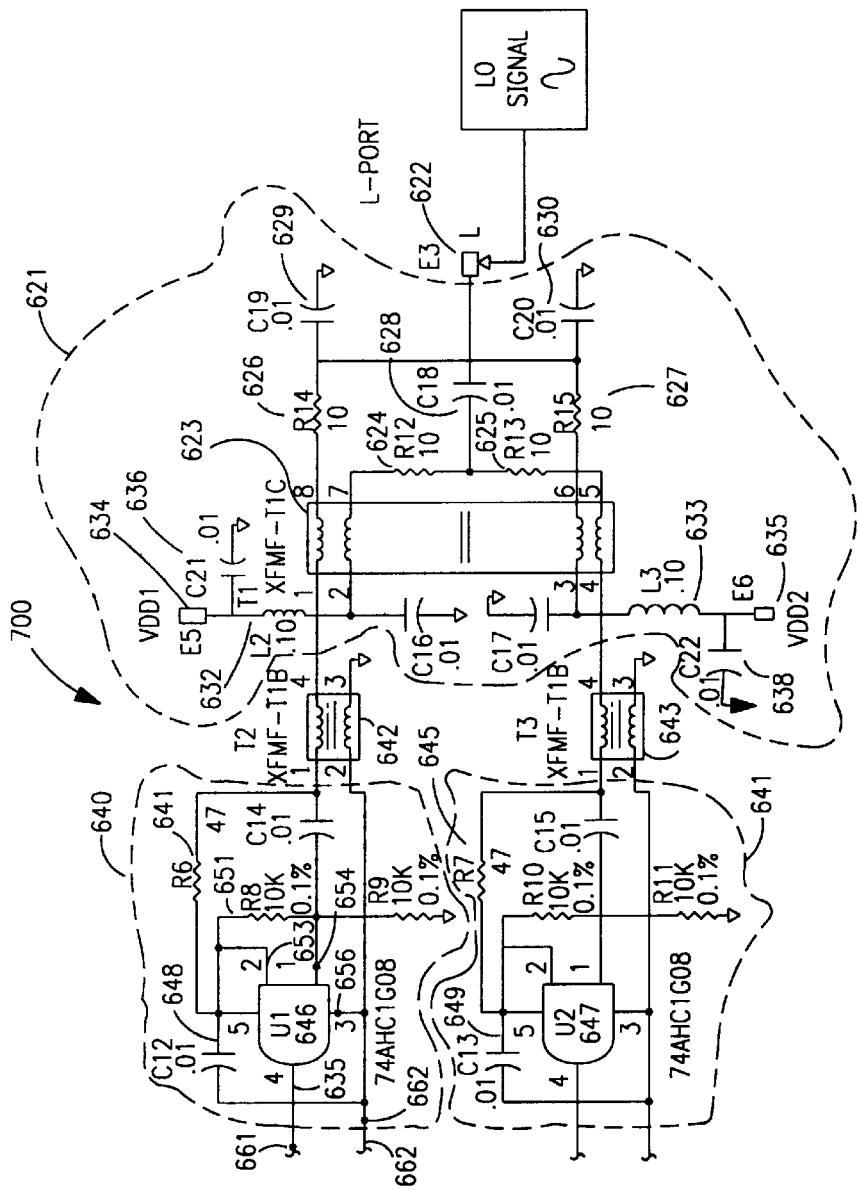

Having described an embodiment relative to the circuit in FIG. 4, we now describe a second mixer 700 embodiment that is particularly suited for a down-frequency converter mixing circuit with respect to FIG. 5. It will be evident from inspection of the circuits in FIG. 4 and FIG. 5, that the primary functional and structural components are the same for the two embodiments, and that only the RF/IF balun network circuits have been modified. In particular, the capacitors C6 693, C7 694, C8 695, and C9 696 provided in the circuit of the up-converter shown in FIG. 4, have been eliminated in the down connector embodiment of FIG. 5, and replaced with capacitor C6 (1.8 pF) connected to the drain (D) terminal of the upper FET in switch Q2 in the embodiment of FIG. 5. The use of the R port and I port have also been reversed in the two embodiments. These different elements provide more optimal operation desired for up- or down-frequency converter operation in the respective circuits, however, either embodiment may be used for up- or down-conversion with some performance loss.

Figure 7A:
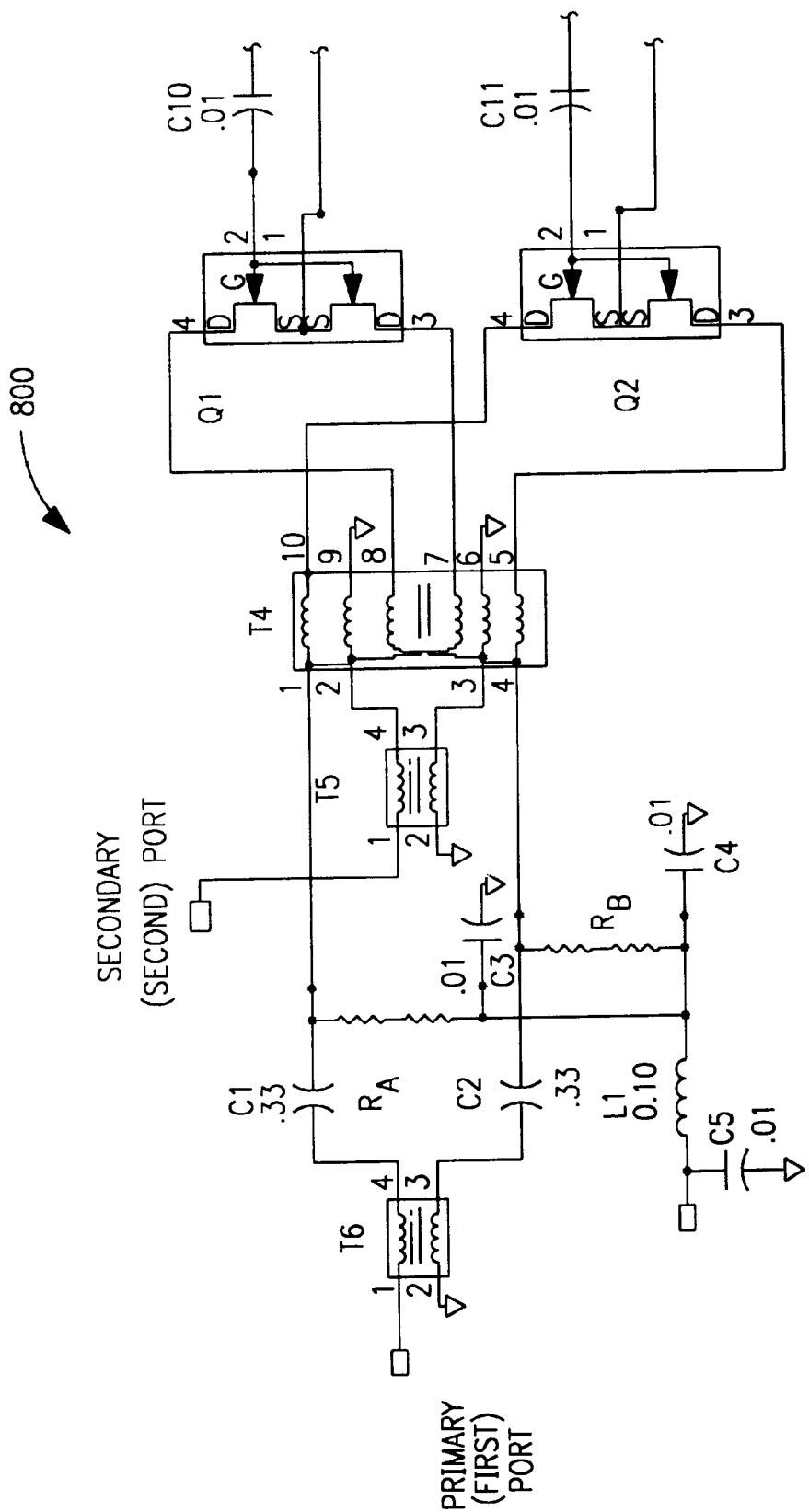
FIG. 7 is an illustration of still another embodiment of the inventive triple-balanced reflection FET mixer showing alternative structure of the local oscillator phase splitter, square wave generators, switching network, and RF/IF baluns, isolation transformers and eliminating some optional circuit elements.
Figure 7B:
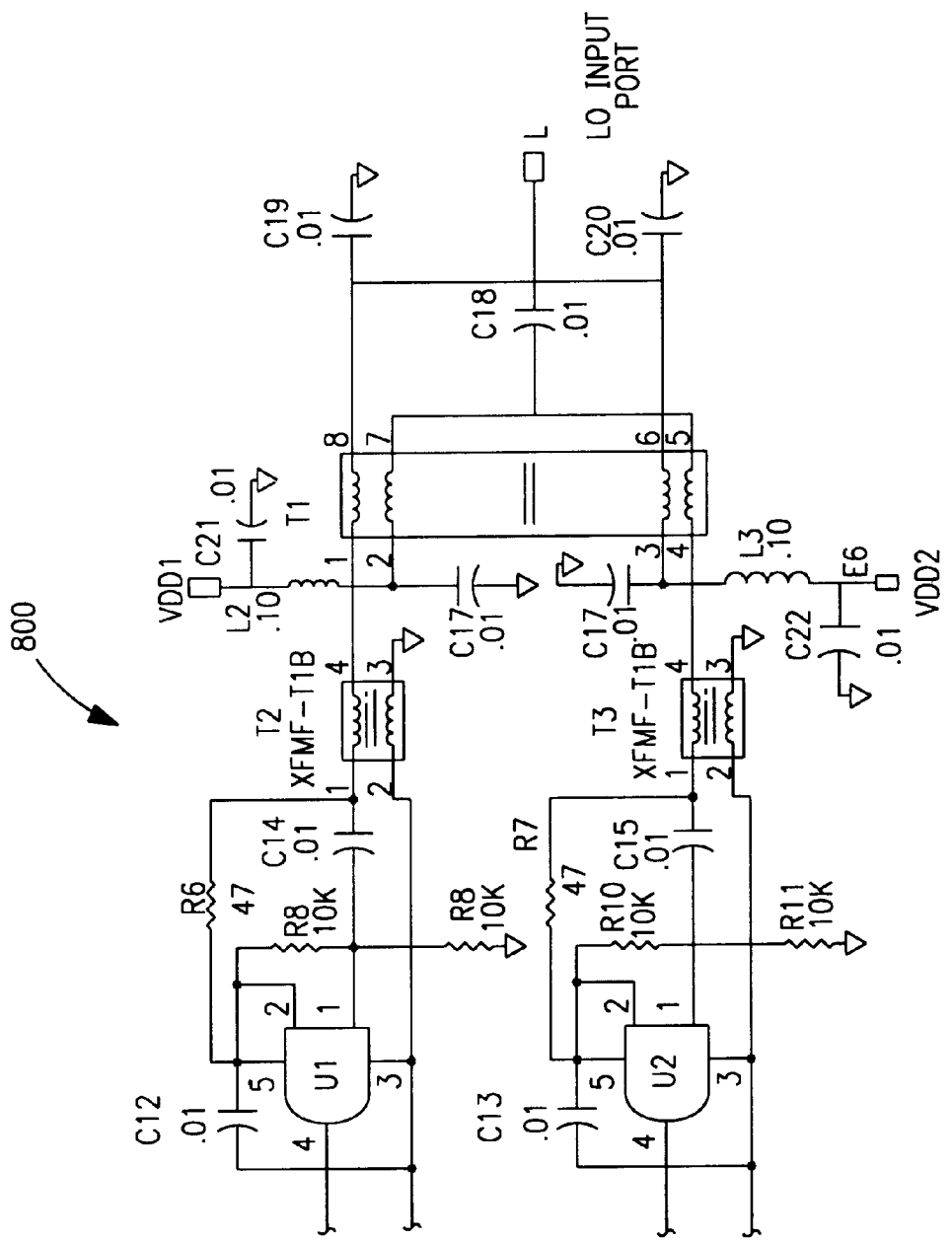

A third alternative mixer 800 embodiment is illustrated in FIG. 7. In this embodiment, several clearly optional components have been eliminated from the mixer circuit. Here, for example, the resistive networks R16, R18, R19, R1 and R17, R20, R21, R2 provided in this serial-parallel combination of FIGS. 4 and 5 for power handling receivers have been simplified to two resistors RA, RB. Also, the resistors provided in the LO input stage (R14, R15, R12, R13) for LO decoupling have been eliminated, as have resistors R4, R5 for FET gate self bias in the gate drive circuit.

Figure 8:
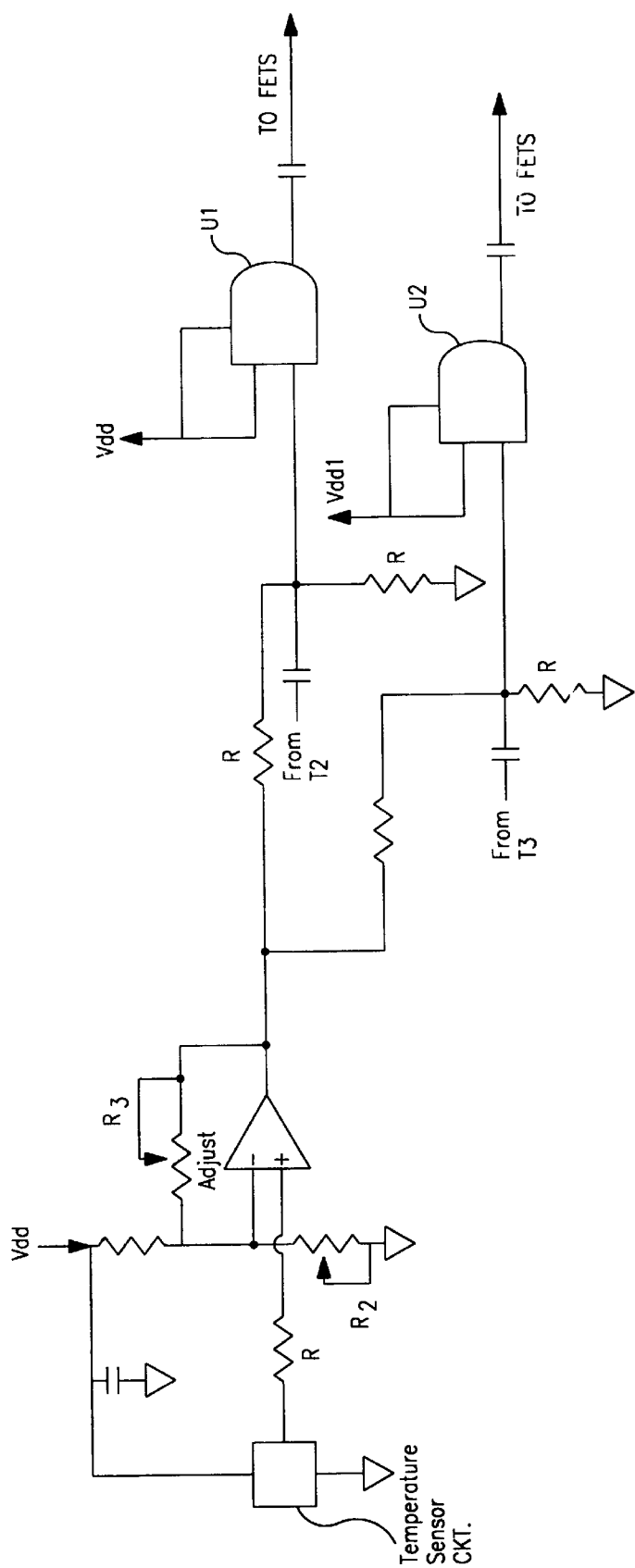
FIG. 8 is an illustration showing an optional temperature compensation circuit for improving the temperature range performance of the inventive structures.

A further performance improvement to the inventive mixer (both up- and down-frequency conversion mixers) may be realized by providing temperature compensation circuitry to compensate the logic gate circuits for operating temperature. In such an embodiment show in FIG. 8, a voltage divider pair of resistors pull-off of the $V_{dd}$ voltage supply terminal of the chip, divide the voltage in half and put the half voltage in the gate to set the operating point. This compensation is desirable because it was discovered that going over the operating temperature range of the mixer, some compensation is at least desirable because the particular CMOS gate (Model No. 74AHC1GOB) manufactured by of Texas Instruments, Inc. has an internal reference voltage that may drift with temperature and it is desirable for the bias point to drift with the drifting reference voltage. As the ambient temperature changes, the temperature sensor puts out a proportional voltage. Initially, at room temperature, resistor R2 is set for 5 volts for gate bias. As the temperature changes, this initial voltage at R3 is adjusted at the temperature limits of −10 C. and +60 C. to compensate for gate bias changes.

In each of the exemplary super-mixer and system topology embodiments, certain elements that enhance or optimize performance as provided, but which components are not required to practice the invention and could be eliminated entirely. While some sacrifice in performance might be expected, the circuits would still operate and so long as other modifications within the ordinary skill in the art were made to compensate for the removal or elimination, such circuit would still perform better than the conventional structures and methods.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

All publications and patents mentioned in this specification are herein incorporated by reference to the same extent as if each individual publication or patent was specifically and individually indicated to be incorporated by reference.

What is claimed is:

1. A mixer comprising:
   a local oscillator input port for receiving an externally generated sinusoidal local oscillator signal at a local oscillator frequency;
   phase splitter means coupled to said local oscillator input port for receiving said local oscillator signal and for generating first and second phase separated signals at said local oscillator frequency and having a substantially 180 degree phase difference between each other;
   voltage potential isolation means for generating first and second differential signal pairs at said local oscillator frequency respectively from said first and second phase separated signals;
   square wave signal generation means for generating first and second floating square waves respectively from said first and second differential signal pairs;
   at least one frequency mixing device having a first switching device and a second switching device and receiving said first and second square wave signals and an input signal from an input port at an input frequency and generating an output signal at an output port at an output signal frequency, each said square wave signal having a slew rate leading and trailing signal edge such that said first switching device switches ON precisely when said second switching device switches OFF to minimize the period of time spent in transition between ON and OFF conduction states of the switching devices; and
   input/output signal separation means for separating said output signal from said input signal and for directing said output signal to an output port.

2. The mixer of claim 1, wherein the square wave signal has a rise time of less than substantially 300 picoseconds and a fall time of less than substantially 300 picoseconds.

3. The mixer of claim 1, wherein said square wave signal generation means comprises a bi-stable circuit generating a substantially constant first amplitude output in response to receiving a first input having first input voltage amplitude in the range between S1 and S2, and generating a second substantially constant voltage amplitude output different from said first voltage amplitude in response to receiving a second input having a second input voltage amplitude in the range between S3 and S4.

4. The mixer of claim 3, wherein said bi-stable circuit comprises a logic gate having first and second output logic states.

5. The mixer of claim 4, wherein said logic gate comprises an AND gate.

6. The mixer of claim 5, wherein said logic gate is selected from the group of gates consisting of: AND, NAND, OR, NOR, XOR, XNOR, and combinations thereof.

7. The mixer of claim 5, wherein said frequency mixing devices comprise a plurality of GaAs FETs.

8. The mixer of claim 6, wherein said logic gate generates a complementary (180-degree) waveform, and wherein no splitting balun is needed.

9. The mixer of claim 1, wherein said frequency mixing device comprises a plurality of FETs.

10. The mixer of claim 1, wherein said switching circuit comprises two pairs of source-to-source serially connected FETs.

11. The mixer of claim 1, wherein said input signal is a radio-frequency (RF) signal and said output signal is an intermediate-frequency (IF) signal.

12. The mixer of claim 3, wherein said first input voltage amplitude is in the range between about −0.5 volts and +0.5 volts, and said second input voltage amplitude is in the range between about 3.5 volts and 6 volts.

13. The mixer of claim 1, wherein said input signal is an intermediate-frequency (IF) signal and said output signal is a radio-frequency (RF) signal.

14. The mixer in claim 1, wherein said mixer is configured as a triple-balanced reflection mixer having a square-wave local oscillator regeneration circuit, regenerating a substantially square wave signal from a substantially sinusoidal local oscillator signal.

15. In a mixer having at least one FET mixing element, a method for generating a mixer output signal using a local oscillator switching signal to switch said FET mixing element between ON and OFF conduction states and reduce distortion in said mixer output signal; said method comprising the steps of:
   receiving a first substantially sinusoidal signal at a first frequency and a second signal;
   generating substantially 180-degree phase separated signals at said first frequency from said received first sinusoidal signal;
   generating a voltage potential isolated differential signal pair at said first frequency from said phase separated signals;
   generating a substantially square-wave signal at said first frequency from said differential signal pair;
   driving said at least one FET mixing element with said substantially square wave signal as a mixer local oscillator signal so that said FET is in an ON conduction state when said square wave output signal is at a first amplitude level and is in an OFF conduction state when said square wave is at a second amplitude level;
   said substantially square-wave signal having a slew rate between said first and second amplitude levels minimizing the period of time said at least one FET mixing element is in an intermediate conduction state between said ON and OFF states; and
   generating said mixer output signal as a product of said second signal and said substantially square-wave signal;
   distortion in said mixer output signal being reduced by minimizing the period of time spent by said FET mixing element in transition between said ON and OFF FET conduction states.

16. A mixer comprising:
   a phase splitter circuit receiving an external local oscillator signal and generating first and second phase separated signals at a local oscillator frequency having substantially 180 degree phase difference between each other;
   an isolation circuit generating first and second differential signal pairs from said first and second phase separated signals;
   a square wave signal generation circuit generating first and second square waves respectively from said first and second differential signal pairs;
   a first switching device and a second switching device receiving said first and second square wave signals and a mixer input signal and generating a mixer output signal, each said square wave signal having a slew rate leading and trailing signal edge such that said first switching device switches ON when said second switching device switches OFF to minimize the period of time spent in transition between ON and OFF conduction states of the switching devices; and a signal separation circuit for separating said mixer output signal from said mixer input signal.

17. The mixer of claim 16, wherein said mixer input signal comprises an intermediate-frequency (IF) signal, and said mixer output signal comprises a radio-frequency (RF) signal.

18. The mixer of claim 16, wherein said mixer input signal comprises a radio-frequency (RF) signal, and said mixer output signal comprises an intermediate-frequency (IF) signal.

19. The mixer of claim 16, wherein the square wave signal has a rise time of less than substantially 300 picoseconds and a fall time of less than substantially 300 picoseconds.

20. The mixer of claim 16, wherein said a square wave signal generation circuit comprises a bi-stable circuit generating a substantially constant first amplitude output in response to receiving a first input having first input voltage amplitude in the range between S1 and S2, and generating a second substantially constant voltage amplitude output different from said first voltage amplitude in response to receiving a second input having a second input voltage amplitude in the range between S3 and S4.

21. The mixer of claim 20, wherein said bi-stable circuit comprises a logic gate having first and second output logic states.

22. The mixer of claim 21, wherein said logic gate comprises an AND gate.

23. The mixer of claim 22, wherein said logic gate is selected from the group of gates consisting of: AND, NAND, OR, NOR, XOR, XNOR, and combinations thereof.

24. The mixer of claim 22, wherein said first and second switching devices comprise FETs.

25. The mixer of claim 22, wherein said first and second switching devices comprise GaAs FETs.

26. The mixer of claim 16, wherein said first and second switching devices comprises pairs of source-to-source serially connected FETs.

27. The mixer of claim 20, wherein said first input voltage amplitude is in the range between about −0.5 volts and about +0.5 volts, and said second input voltage amplitude is in the range between about 3.5 volts and about 6 volts.

28. In a mixer having a signal mixing element, a method for generating a low-distortion mixer output signal comprising the steps of:

receiving a first sinusoidal signal;

generating two 180-degree phase separated signals from said received first sinusoidal signal;

generating a pair of voltage isolated differential signals from said each of said phase separated signals;

receiving said pairs of differential signals and generating a substantially square-wave mixer switching signal at a local oscillator frequency from said two-pairs of differential signals;

driving said signal mixing element with said square-wave signal to drive said signal mixing element to either an ON conduction state when said square-wave signal is at a first signal level or an OFF conduction state when said square-wave signal is at a second signal level to minimize the period of time said signal mixing element generates distortion components while in an intermediate conduction state between said ON and OFF conduction states; and generating said mixer output signal as a product of said square-wave signal at said local oscillator frequency and a second input signal, distortion signal components in said mixer output signal being reduced by virtue of having reduced the period of time spent in transition between said ON and OFF FET conduction states.

29. The method of claim 28, wherein said signal mixing element comprises at least one FET, and said step of driving said signal mixing element comprises driving said FET with said square-wave signal to drive said FET to either an ON conduction state when said square-wave signal is at a first signal level or an OFF conduction state when said square-wave signal is at a second signal level and to minimize the period of time said FET is in an intermediate conduction state between said ON and OFF conduction states.

30. The method of claim 28, wherein said step of generating a high-slew rate substantially square-wave mixer switching signal at a local oscillator frequency comprises generating a substantially square wave signal having a rise time of less than substantially 300 picoseconds and a fall time of less than substantially 300 picoseconds.

31. The method of claim 28, wherein said step of generating said mixer output signal comprises generating a radio-frequency (RF) signal as a product of said square-wave signal at said local oscillator frequency and an intermediate-frequency (IF) signal.

32. The method of claim 28, wherein said step of generating said mixer output signal comprises generating a an intermediate-frequency (IF) signal as a product of said square-wave signal at said local oscillator frequency and a radio-frequency (RF) signal.

33. The method of claim 28, wherein said step of generating said substantially square-wave mixer switching signal at a local oscillator frequency from an externally generated input signal comprises generating a substantially constant first amplitude output in response to receiving a first input having first input voltage amplitude in the range between about −0.5 volts and about +0.5 volts, and generating a second substantially constant voltage amplitude output different from said first voltage amplitude in response to receiving a second input having a second input voltage amplitude in the range between about 3.5 volts and about 6 volts.

34. The method of claim 28, wherein said step of generating said substantially square-wave mixer switching signal at a local oscillator frequency from an externally generated input signal comprises generating said mixer switching signal by receiving a substantially sinusoidal signal at an input to a bi-stable logic gate and extracting said mixer switching signal at an output from said bi-stable logic gate.

35. The method of claim 34, wherein said logic gate is selected from the group of gates consisting of: AND, NAND, OR, NOR, XOR, XNOR, and combinations thereof.

* * * * *

UNITED STATES PATENT AND TRADEMARK OFFICE
CERTIFICATE OF CORRECTION

PATENT NO. : 6,144,236
DATED : November 7, 2000
INVENTOR(S) : Vice et al.

It is certified that error appears in the above-identified patent and that said Letters Patent is hereby corrected as shown below:

Column 22, line 24: delete "high slew rate".

Signed and Sealed this

Eighth Day of May, 2001

Attest:

NICHOLAS P. GODICI

Attesting Officer

Acting Director of the United States Patent and Trademark Office